(12) United States Patent
Pokhriyal et al.

(10) Patent No.: US 10,205,075 B2
(45) Date of Patent: Feb. 12, 2019

(54) SEMICONDUCTOR LIGHT EMITTING DEVICE INCLUDING CAP STRUCTURE AND METHOD OF MAKING SAME

(71) Applicant: GLO AB, Lund (SE)

(72) Inventors: Anusha Pokhriyal, Sunnyvale, CA (US); Mariana Munteanu, Sunnyvale, CA (US); Fariba Danesh, Pleasanton, CA (US)

(73) Assignee: GLO AB, Lund (SE)

( * ) Notice: Subject to any disclaimer, the term of this patent is extended or adjusted under 35 U.S.C. 154(b) by 0 days.

(21) Appl. No.: 15/826,048

(22) Filed: Nov. 29, 2017

(65) Prior Publication Data

US 2018/0159005 A1    Jun. 7, 2018

Related U.S. Application Data

(60) Provisional application No. 62/428,799, filed on Dec. 1, 2016.

(51) Int. Cl.
*H01L 33/00* (2010.01)
*H01L 33/62* (2010.01)
(Continued)

(52) U.S. Cl.
CPC .............. *H01L 33/62* (2013.01); *H01L 24/27* (2013.01); *H01L 24/29* (2013.01); *H01L 33/007* (2013.01); *H01L 33/06* (2013.01); *H01L 33/10* (2013.01); *H01L 33/12* (2013.01); *H01L 33/20* (2013.01); *H01L 33/32* (2013.01); *H01L 33/38* (2013.01); *H01L 33/405* (2013.01); *H01L 33/44* (2013.01); *H01L 33/60* (2013.01); *H01L 2224/29083* (2013.01); *H01L 2224/29109* (2013.01); *H01L 2224/29111* (2013.01); *H01L 2224/29139* (2013.01); *H01L 2224/29144* (2013.01); *H01L 2224/29147* (2013.01); *H01L 2224/29155* (2013.01); *H01L 2224/29166* (2013.01); *H01L 2224/29169* (2013.01);
(Continued)

(58) Field of Classification Search
CPC ....... H01L 33/20; H01L 33/405; H01L 33/60; H01L 33/10
See application file for complete search history.

(56) References Cited

U.S. PATENT DOCUMENTS

2012/0181561 A1*   7/2012   Fujimori ............... H01L 33/405
                                                              257/98
2012/0193660 A1*   8/2012   Donofrio .............. H01L 33/505
                                                              257/98

(Continued)

*Primary Examiner* — Ngan Ngo
(74) *Attorney, Agent, or Firm* — The Marbury Law Group PLLC

(57) ABSTRACT

A light emitting device and method of forming the same, the light emitting device including: a substrate, a buffer layer disposed on the substrate, a semiconductor mesa disposed on the buffer layer and including a first semiconductor layer, a light emitting active layer disposed on the first semiconductor layer, and a second semiconductor layer disposed on the first semiconductor layer, a contact layer disposed on an upper surface of the mesa, a passivation layer covering sidewalls of the mesa and the contact layer, and a cap structure including a reflective layer covering an upper surface of the contact layer, and a solder layer including a recess in which the reflective layer is disposed.

17 Claims, 8 Drawing Sheets

(51) Int. Cl.
*H01L 33/12* (2010.01)
*H01L 33/20* (2010.01)
*H01L 33/32* (2010.01)
*H01L 33/38* (2010.01)
*H01L 33/44* (2010.01)
*H01L 33/60* (2010.01)
*H01L 23/00* (2006.01)
*H01L 33/06* (2010.01)
*H01L 33/40* (2010.01)
*H01L 33/10* (2010.01)

(52) U.S. Cl.
CPC .............. *H01L 2224/29171* (2013.01); *H01L 2224/29184* (2013.01); *H01L 2924/014* (2013.01); *H01L 2924/12041* (2013.01); *H01L 2933/0016* (2013.01); *H01L 2933/0025* (2013.01); *H01L 2933/0058* (2013.01); *H01L 2933/0066* (2013.01)

(56) References Cited

U.S. PATENT DOCUMENTS

| | | | |
|---|---|---|---|
| 2012/0193661 A1* | 8/2012 | Emerson | H01L 33/20 257/98 |
| 2015/0372208 A1* | 12/2015 | Chae | H01L 33/62 257/99 |
| 2016/0013388 A1* | 1/2016 | Lee | H01L 27/156 257/13 |
| 2016/0111614 A1* | 4/2016 | Lee | H01L 33/483 257/98 |
| 2016/0240759 A1* | 8/2016 | Chae | H01L 33/36 |
| 2017/0141260 A1* | 5/2017 | Chen | H01L 33/46 |
| 2017/0162552 A1 | 6/2017 | Thompson | |
| 2018/0240952 A1* | 8/2018 | Moon | H01L 33/36 |

\* cited by examiner

US 10,205,075 B2

SEMICONDUCTOR LIGHT EMITTING DEVICE INCLUDING CAP STRUCTURE AND METHOD OF MAKING SAME

FIELD

Aspects of the present disclosure relate to semiconductor light emitting devices, such as light emitting diodes (LED), and in particular to LEDs having a reflective cap structure.

BACKGROUND

Semiconductor devices are ubiquitous in modern society and semiconductor manufacturers, for example manufacturers of solid state lighting devices, are constantly seeking to improve the performance of their products. Recently, light emitting devices based on gallium nitride (GaN) have found a wide range of application. In particular, high brightness LEDs based on GaN have been widely used, for example in backlighting of LCDs, traffic signals, full color displays and street lights. GaN LEDs have also recently started to enter the general lighting market.

In order to be more effective in general lighting applications, the performance of GaN LEDs should be further improved. Accordingly, there is a need for GaN LEDs having improved light extraction efficiency.

SUMMARY

According to various embodiments a light emitting device includes a substrate; a buffer layer disposed on the substrate; a semiconductor mesa disposed on the buffer layer and including a first semiconductor layer, a light emitting active layer disposed on the first semiconductor layer, and a second semiconductor layer disposed on the first semiconductor layer; a contact layer disposed on an upper surface of the mesa; a passivation layer covering sidewalls of the mesa and the contact layer; and a cap structure including a reflective layer covering an upper surface of the contact layer, and a solder layer comprising a recess in which the reflective layer is disposed.

According to various embodiments a method of forming a light emitting device includes forming a stack of semiconductor layers on a buffer layer located over a growth substrate, etching the stack to form mesas, the mesas each comprising, a first semiconductor layer, a light emitting active layer disposed on an upper surface of the first semiconductor layer, and a second semiconductor layer disposed on an upper surface of the active layer, forming contact layers on the stack, wherein the contacts layers cover upper surfaces of the mesas, forming passivation layers that cover side surfaces of the mesas and the contact layers, and etching the buffer layer, such that the mesas each include the buffer layer disposed between the first semiconductor layer and the growth substrate.

DETAILED DESCRIPTION

Figure 1:
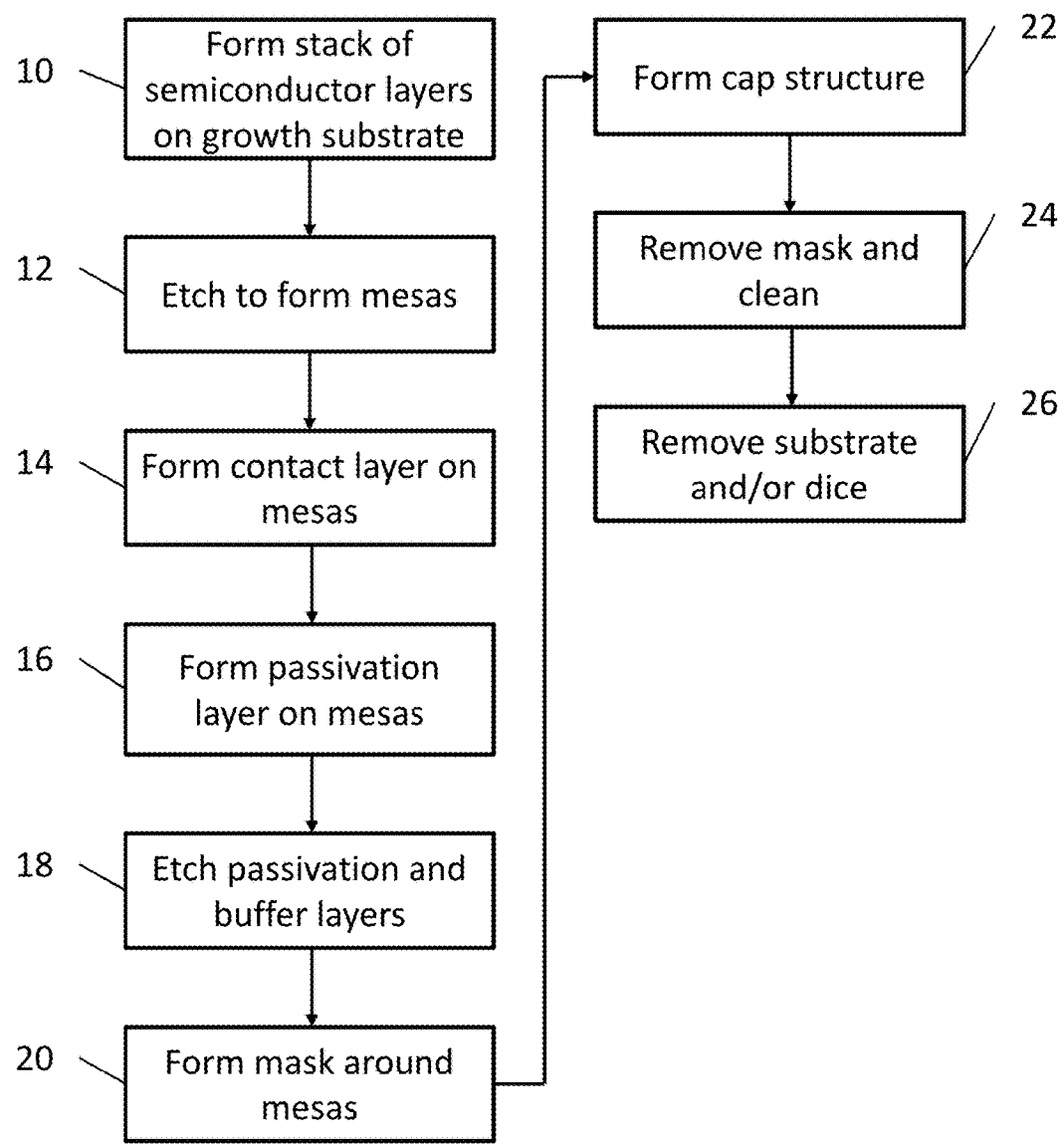
FIG. 1 is a flow chart illustrating a method of forming a light emitting device, according to various embodiments of the present disclosure.

As stated above, the present disclosure is directed to a light emitting device and a method of manufacturing the same, the various aspects of which are described below. Throughout the drawings, like elements are described by the same reference numeral. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. In particular, a metallic layer such as a bond pad may be described as being formed "on" an ohmic contact. It will be understood by those skilled in the art that intervening layers, such as for example barrier layers, adhesion layers and/or reflective layers, may be positioned between the bond pad and the ohmic contact.

Relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, a "light emitting device" refers to any device that is configured to emit light and includes, but is not limited to, a light emitting diode (LED), a laser, such as a vertical-cavity surface-emitting laser (VCSEL), and any other electronic device that is configured to emit light upon application of a suitable electrical bias. A light emitting device may be a vertical structure (e.g., a vertical LED) in which the p-side and n-side contacts are located on opposite sides of the structure or a lateral structure in which the p-side and n-side contacts are located on the same side of the structure. As used herein, a "light emitting device assembly" refers to an assembly in which at least one light emitting device is structurally fixed with respect to a carrier structure, which can include, for example, a substrate, a matrix, or any other structure configured to provide stable mechanical support to the at least one light emitting device.

Devices can be fabricated on growth substrates. As used herein, a "growth substrate" refers to a substrate that is processed to form devices thereupon or therein. The devices can include light emitting devices. The light emitting devices can be any type of light emitting devices, i.e., vertical light emitting devices, lateral light emitting devices, or any combination thereof. The devices can be formed as an array on growth substrates.

FIG. 1 is a flow chart illustrating a method of forming a light emitting device, according to various embodiments of the present disclosure. FIGS. 2-9 show cross-sectional views of a layered semiconductor-containing structure at various stages during the process of FIG. 1, according to various embodiments of the present disclosure.

Referring to FIGS. 1-9, step 10 of the method may include forming a stack 100 of semiconductor layers on a growth substrate 101. A buffer layer 102 may be formed between the growth substrate 101 and the stack 100. The buffer layer 102 may be formed of a semiconductor material, such as GaN, AlGaN, or the like. The growth substrate 101 may be a patterned sapphire substrate, a single-side polished sapphire substrate, a gallium nitride substrate, or a silicon substrate. The stack 100 may be formed on a patterned surface of the growth substrate 101.

The stack 100 may include an active layer 104 disposed between a first semiconductor layer 103 and a second semiconductor layer 105. The first and second semiconductor layers 103, 105 may include a group III-V semiconductor material, such as GaN or the like. The first and second semiconductor layers 103, 105 may have different conductivity types. For example, the first semiconductor layer 103 may include n-type dopant, and the second semiconductor layer 105 may include a p-type dopant layer 105. For convenience, the first and second semiconductor layers 103, 105 may be respectively referred to as an n-doped layer and a p-doped layer. However, in some embodiments, the first semiconductor layer 103 may include p-type dopant, and the second semiconductor layer 105 may include an n-type dopant.

The active layer 104 may be a light emitting layer having a multiple quantum well (MQW) structure. In some embodiments, the active layer 104 may include MQW structures formed of InGaN well layers and GaN barrier layers. However, other suitable light emitting materials may be used.

Figure 2:
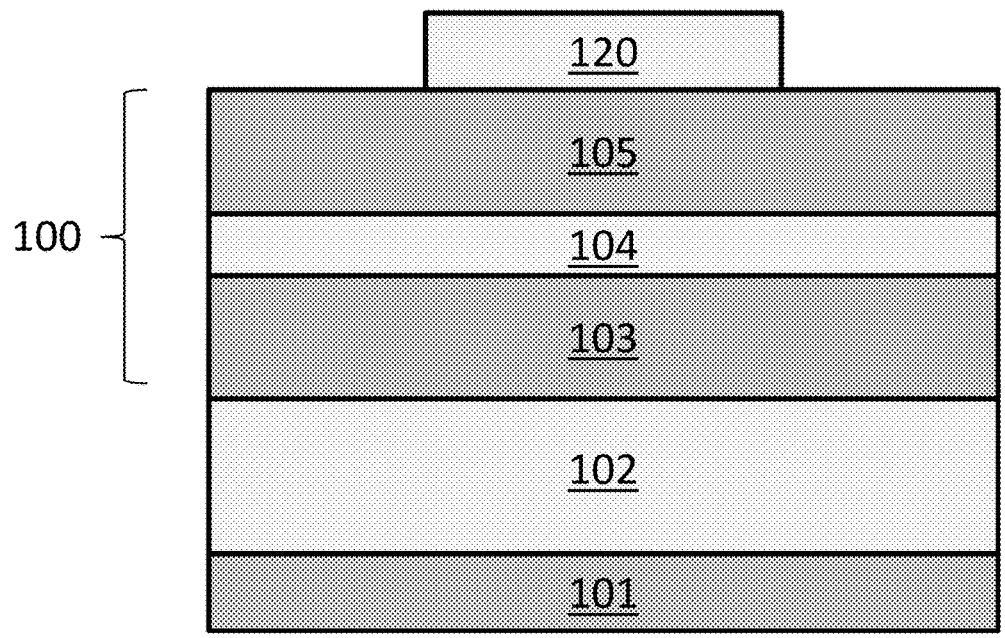
FIGS. 2-9 show cross-sectional views of a layered semiconductor-containing structure at various stages during the process of FIG. 1, according to various embodiments of the present disclosure.
Figure 3:
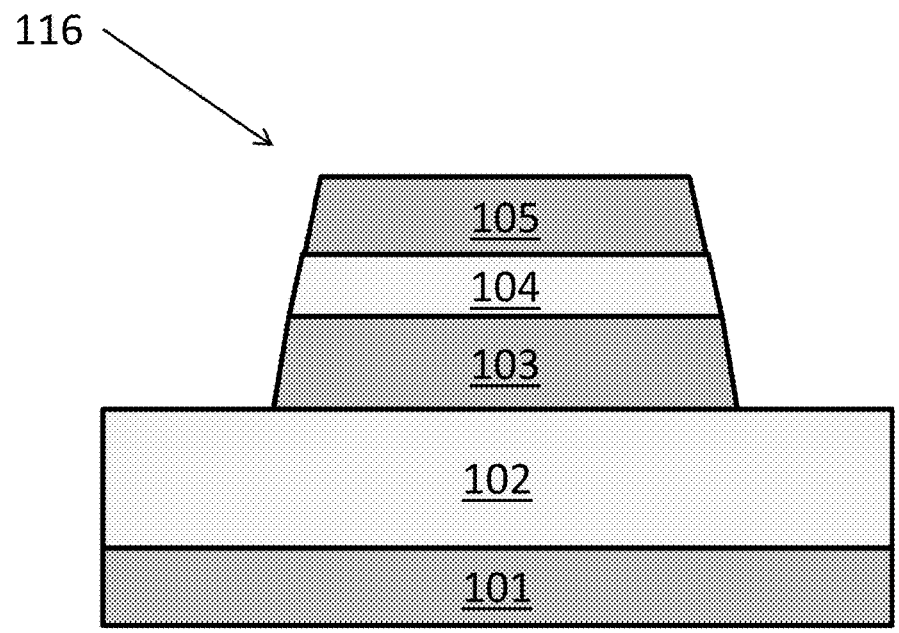

In step 12, the stack 100 may be etched to form one or more mesas 116, as shown in FIGS. 2 and 3, by forming a masking layer 120 (e.g., a photoresist) as shown in FIG. 2, and then etching layers 103, 104, and 105 to form the mesas 116, as shown in FIG. 3. While only one mesa 116 is shown in FIG. 3, a plurality of mesas may be formed from the stack 100. The mesas 116 may be rectangular, circular, ovoid, triangular, or the like when viewed from above. The mesas 116 may have angled side walls to facilitate light extraction.

Figure 4:
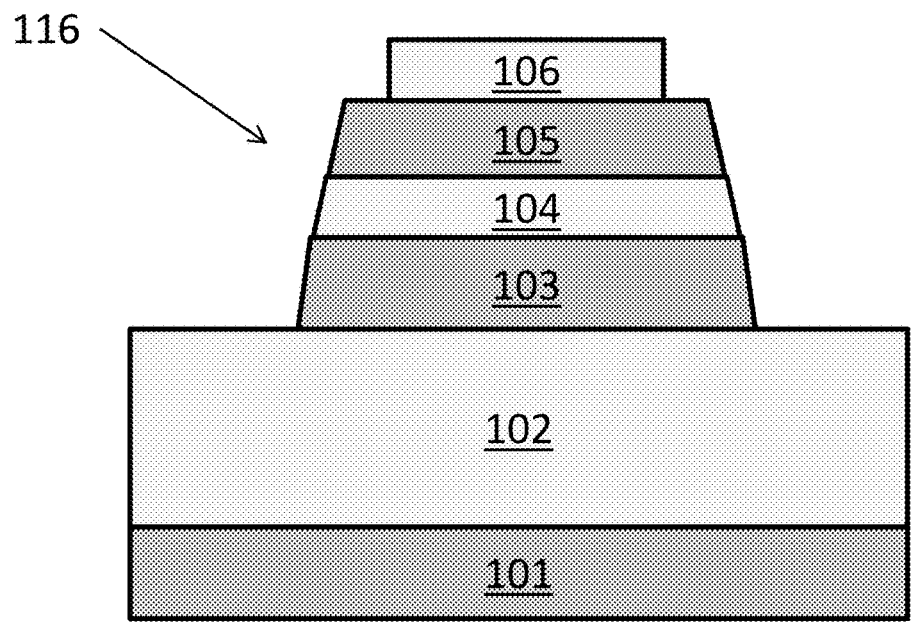

In step 14, a contact layer 106 may be formed on the upper surface of the mesa 116, as shown in FIG. 4. The contact layer 106 may be formed by any suitable method, such as by patterning a deposited thin film by etching, by using a liftoff method, or the like. The contact layer 106 may be formed of a conductive material, such as a metal or alloy. For example, the contact layer 106 may be a p-side electrode formed of indium tin oxide (ITO), Al, Ag, Ni, or any combination thereof. In some embodiments, the contact layer 106 may include multiple layers of one or more different conductive and/or reflective materials. The contact layer 106 may cover from about 50% to about 95% of the upper surface of each mesa 116.

Figure 5:
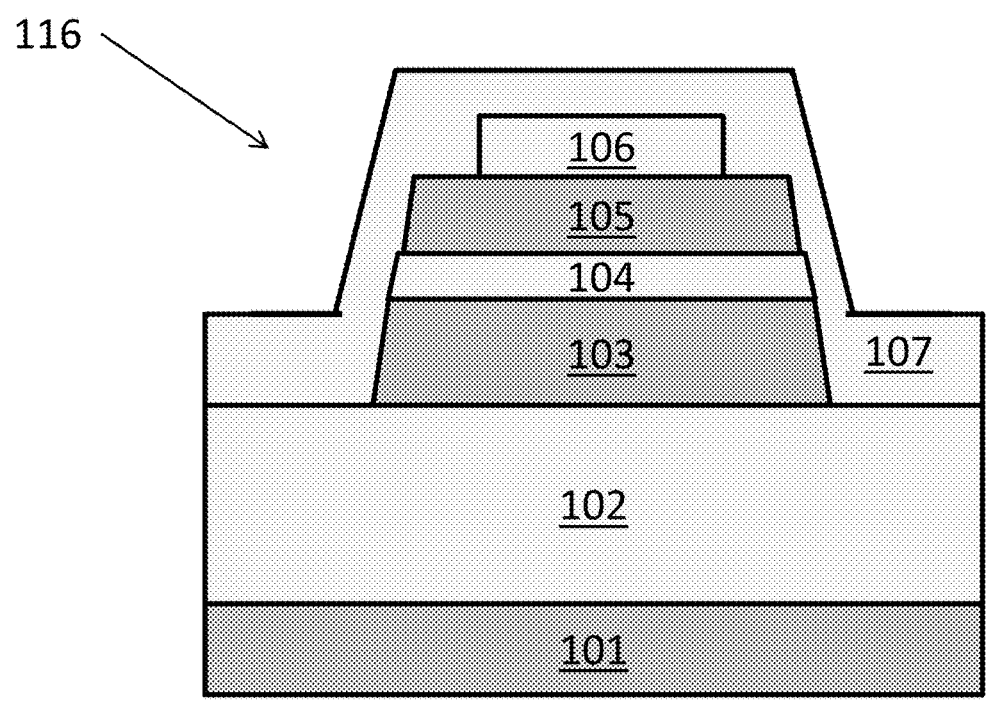

In step 16, a passivation layer 107 may be formed on the mesa 116, as shown in FIG. 5. The passivation layer 107 may include an insulating inorganic material, such as silicon oxide ($SiO_x$), silicon nitride ($SiN_x$), $Al_2O_3$, ZnO, $ZrO_2$, $TiO_2$, $Nb_2O_5$, and $Ta_2O_5$. The passivation layer may contact an exposed portion of the upper surface of the mesa 116, and sidewalls of the mesa 116.

Figure 6:
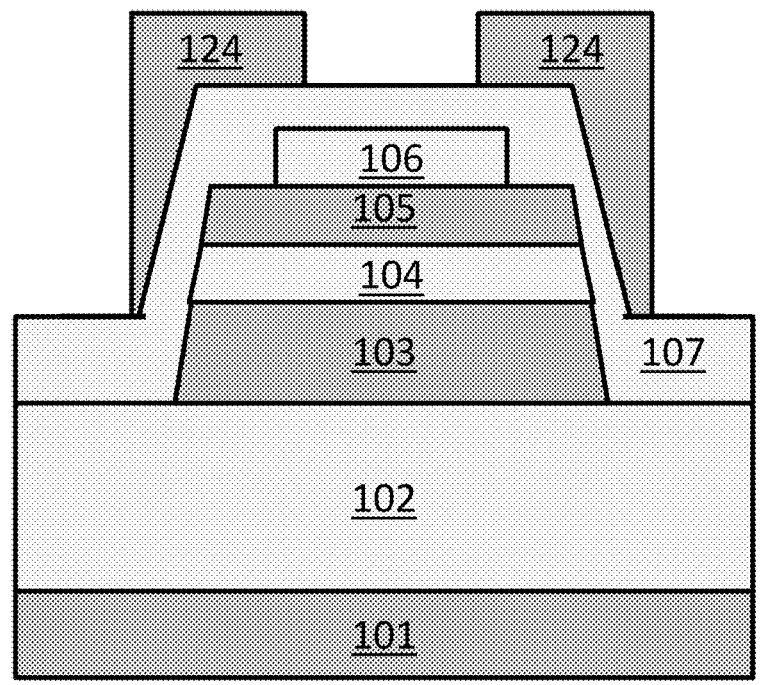

In step 18, the passivation layer 107 and the buffer layer 102 may be etched. In particular, a mask layer 124 may be formed on the passivation layer 107, as shown in FIG. 6. The mask layer 124 may be a photoresist layer patterned to expose portions of the passivation layer 107 that cover the contact layer 106 and the buffer layer 102.

Figure 7:
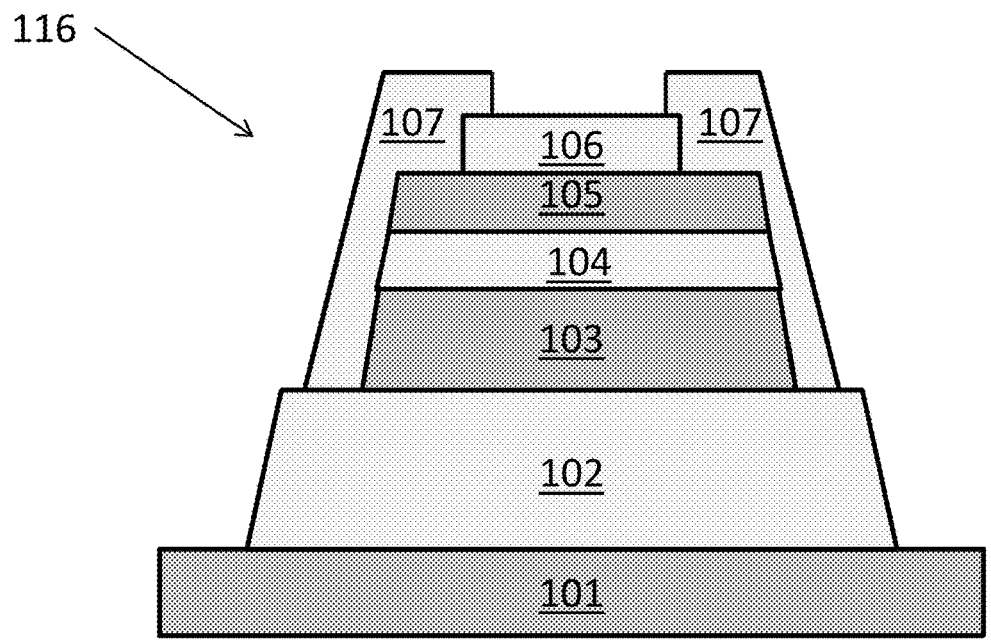

The passivation layer 107 may then be etched using the mask layer 124 as a mask. In particular, the contact layer 106 may be exposed through an opening etched into the passivation layer 107, as shown in FIG. 7. Sidewalls and edges of the upper surface of the contact layer 106 may be covered with the passivation layer 107, in some embodiments. Further, the buffer layer 102 may be etched to expose portions of the growth substrate 101. The etched buffer layer 102 may form a bottom layer of the mesa 116, and the resultant larger mesa 116 may be cleaned. The patterned photoresist 124 may be removed and the mesa 116 optionally cleaned, as shown in FIG. 7.

Figure 8:
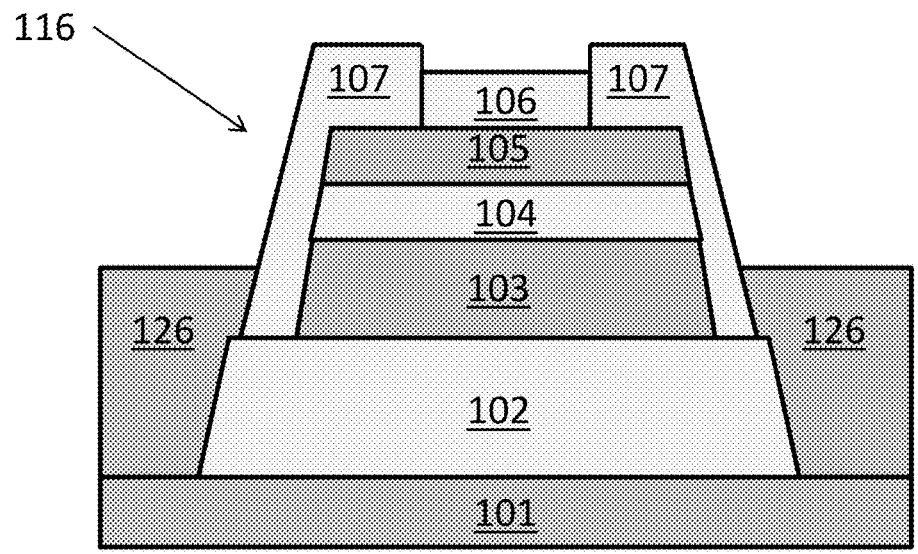

In step 20, a mask layer 126 may be formed around the mesa 116, as shown in FIG. 8. The mask layer 126 may be a temporary layer (e.g., a photoresist or other sacrificial layer). In other embodiments, the mask layer 126 may be a permanent insulating layer, such as a silicon oxide or silicon nitride layer. The mask layer 126 may cover side surfaces of the mesa 116, and an upper portion of the mesa 116 may protrude above the mask layer 126. In some embodiments, the upper surface of the mask layer 126 may be approximately coplanar with the upper surface of the first semiconductor layer 103. In other words, the mask layer 126 may cover the side surfaces of the mesa 116, up to about the bottom surface of the active layer 104.

Figure 9:
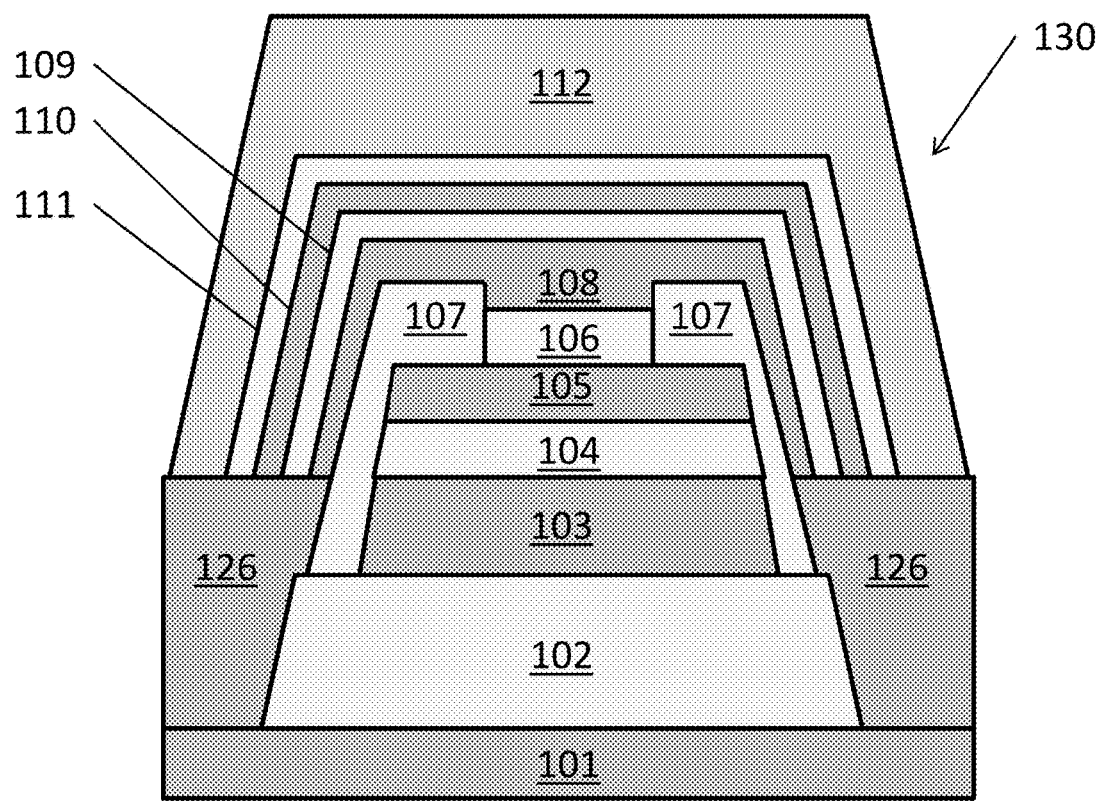

In step 22, an electrically conductive cap structure 130 may be formed on protruding upper portion of the mesa 116 and on the mask layer 126, as shown in FIG. 9. The cap structure 130 may be configured to operate as a p-side electrical contact to the mesa 116 (e.g., may electrically contact the contact layer 106). In some embodiments, the lower surface of the cap structure 130 may be recessed, such that the cap structure 130 may be configured to surround the protruding upper portion of the mesa 116 that extends above the mask layer 126. The cap structure 130 may be insulated from sidewalls of the mesa 116 by the passivation layer 107. The cap structure 130 may be configured to reflect light generated by the active layer 104 towards the buffer layer 102.

The cap structure may 130 include a reflective layer 109 and a solder layer 112. The reflective layer 109 may be configured to cover upper and side surfaces of the second semiconductor layer 105 and the active layer 104. The reflective layer 109 may include a reflective metal, such as Al, Au, Ag, or a combination thereof. The reflective layer may have a thickness ranging from about 500 to about 50,000 angstroms. The reflective layer 109 may be configured to reflect light generated by the active layer 104 towards the buffer layer 102.

The solder layer 112 may cover upper and side surfaces of the reflective layer 109. The solder layer 112 may include pure Sn, or a Sn alloy such as SnAu, SnAg, SnCu, SnAgCu, SnIn, SnNi, and SnAuNi. In some embodiments, the solder layer 112 may be formed by depositing multiple metal layers, which may include different metals or metal alloys, and then heating the layers according to a controlled reflow process to mix the metals or metal alloys. The reflow process may be configured to impart particular electrical and/or mechanical properties to the solder layer 112. For example, the solder layer 112 may be formed by depositing one or more layers of Sn, Au, Ag, Au, Cu, In, Ni, and then reflowing the layers to mix the same.

The cap structure may optionally include one or more of a first adhesion layer 108, a second adhesion layer 110, and/or a wetting layer 111. The first adhesion layer 108 may optionally be disposed between the contact layer 106 and the reflective layer 109 and may operate to increase adhesion of the reflective layer 109 to the mesa 116. The first adhesion layer 108 may cover sidewalls of the mesa 116 and contact the passivation layer 107 and the contact layer 106. The first adhesion layer 108 may be electrically insulated from sidewalls of the semiconductor layers 103, 105, and/or the active layer 104 by the passivation layer 107. The first adhesion layer 108 may include Ni, Ti, Pt, TiW, Cr, or a combination thereof. The first adhesion layer 108 may have a thickness ranging from about 10 to about 5000 angstroms, for example.

The second adhesion layer 110 may optionally be disposed between the reflective layer 109 and the solder layer 112. For example, the second adhesion layer 110 may cover upper and side surfaces of the reflective layer 109. The second adhesion layer 110 may include one or more layers of Ni, Ti, Pt, TiW, Cr, or a combination thereof. The second adhesion layer 110 may have a thickness ranging from about 10 to about 5000 angstroms, for example.

The wetting layer 111 may optionally be disposed between the reflective layer 109 and the solder layer 112. For example, the wetting layer 111 may cover upper and side surfaces of the second adhesion layer 110 or the reflective layer 109. The wetting layer 111 may operate to increase the flowability of the solder layer 112. The wetting layer 111 may include one or more layers of Ni, Pt, TiW, Cr, Au, Cu, Ag, or a combination thereof. The wetting layer 111 may have a thickness ranging from about 10 to about 5000 angstroms, for example.

Figure 10:
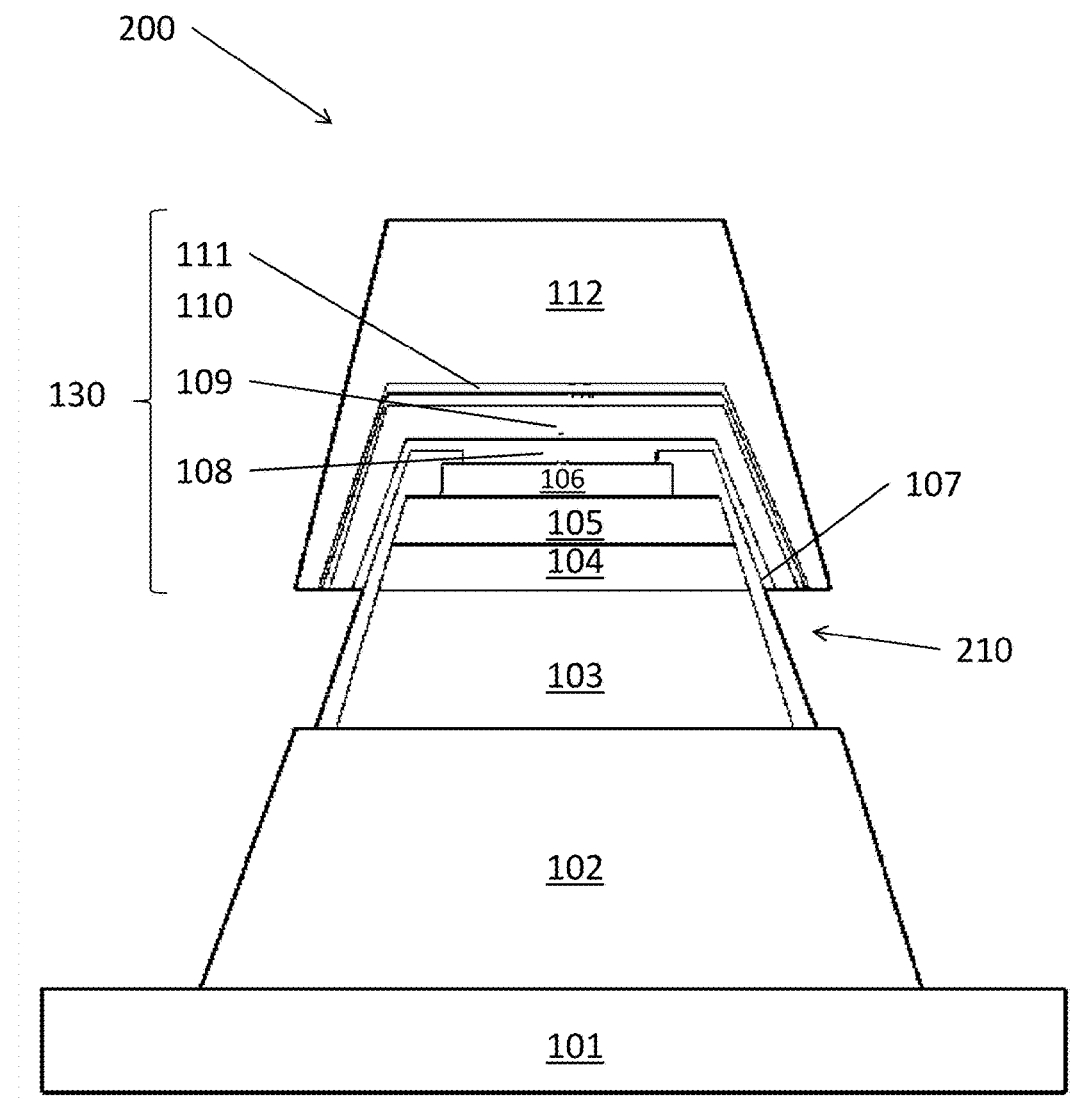
FIG. 10 is cross-sectional view of an embodiment light emitting device made by the steps shown in FIGS. 2-9.

In step 24, the method may optionally include removing the mask layer 126 and/or a dicing process, resulting in a semiconductor device 200, as shown in FIG. 10. The semiconductor device 200 may include a recess 210 at least partially defined by sidewalls of the first semiconductor layer 103 covered by the passivation layer 107 and a lower surface of the capping structure 130. In other words, the cap structure 130 may extend to face sidewalls of the second semiconductor layer 105 and/or the active layer 104 (e.g., onto corresponding surfaces of the passivation layer 107 that cover the second semiconductor layer 105 and the active layer 104). In some embodiments, the cap structure 130 may not extend over the sidewalls of the first semiconductor layer 103 (e.g., may not be disposed on corresponding surfaces of the passivation layer 107 that cover the sidewalls of the first semiconductor layer 103). Alternatively, the mask layer 126 may be retained in a final device, if the mask layer 126 is a permanent insulating layer.

The method may optionally include step 26, where the growth substrate 101 may be removed and/or the semiconductor devices 200 may be diced into individual units, as shown in FIG. 10, or groups of two or more semiconductor devices 200. In other embodiments, one or more of the semiconductor devices 200 may remain on the growth substrate 101.

Figure 11:
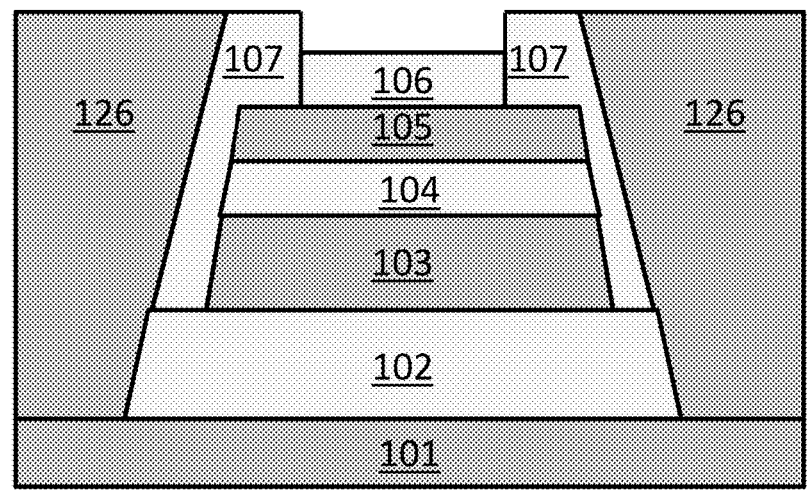
FIGS. 11-13 are cross-sectional view of light emitting devices, according to alternative embodiments of the present disclosure.
Figure 12:
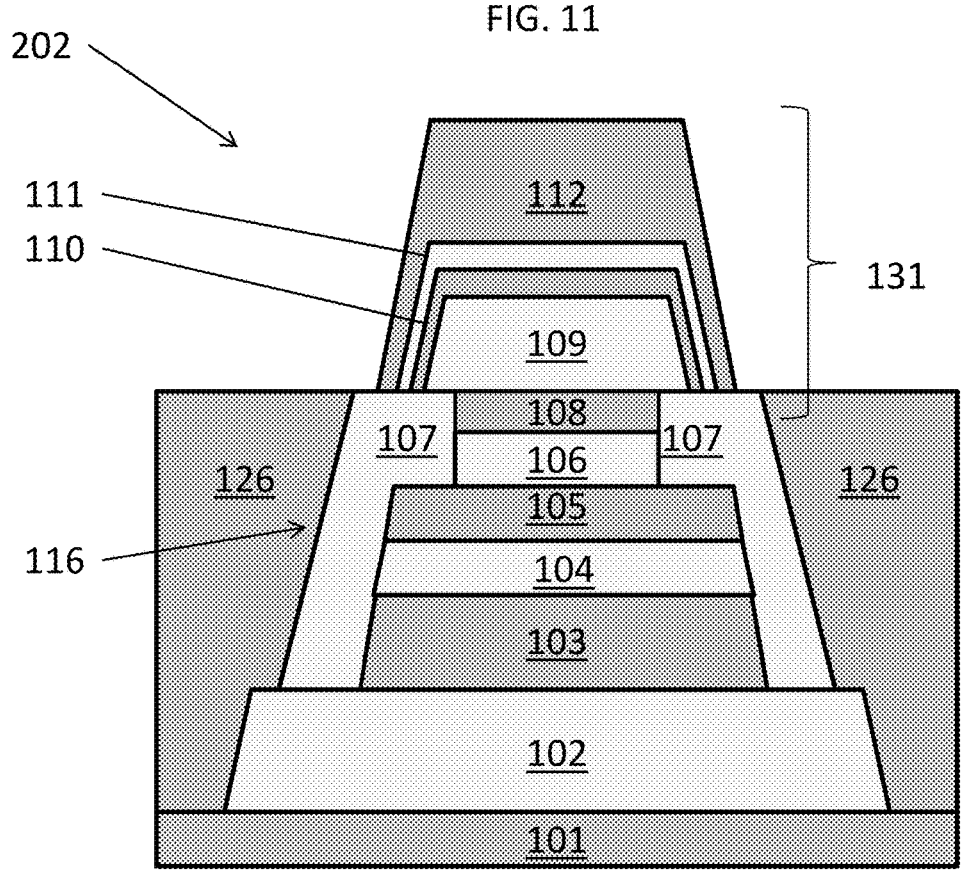

According to various alternative embodiments, step 20 may be modified, such that the mask layer 126 covers substantially all of the sidewalls of the passivation layer 107, as shown in FIG. 11. In other words, the upper surface of the mask layer 126 may substantially coplanar with the upper surface of the passivation layer 107. Step 22 may also be modified to form a cap structure 131, as shown in FIG. 12. The cap structure 131 may be similar to the cap structure 130, so only the differences therebetween will be discussed in detail.

Figure 13:
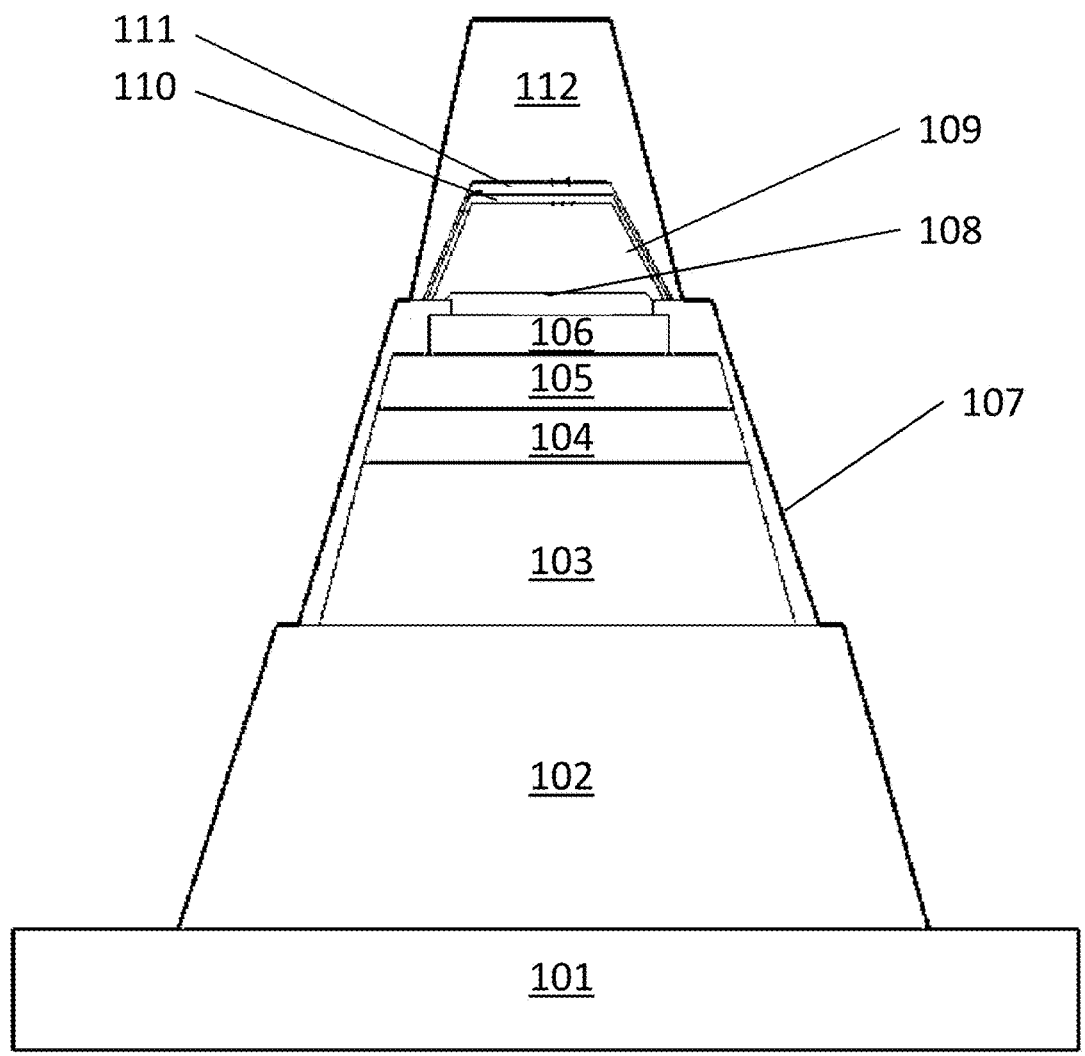

As shown in FIGS. 12 and 13, the cap structure 131 may be disposed on top of the mesa 116. In other words, the cap structure 131 may not extend onto sidewalls of the mesa 116. The mirror layer 109 of the cap structure 131 may be frusto-pyramidal in shape. The solder layer 112 and/or the adhesion and wetting layers 110, 111 may cover the upper surface and sidewalls of the reflective layer 109. The structure of the reflective layer 109 may result in the formation of a recess in the lower surface of the solder layer 112 and/or the adhesion and wetting layers 110, 111.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. Where an embodiment employing a particular structure and/or configuration is illustrated in the present disclosure, it is understood that the present invention may be practiced with any other compatible structures and/or configurations that are functionally equivalent provided that such substitutions are not explicitly forbidden or otherwise known to be impossible to one of ordinary skill in the art.

What is claimed is:

1. A light emitting device comprising:
   a substrate;
   a buffer layer disposed on the substrate;
   a semiconductor mesa disposed on the buffer layer and comprising a first semiconductor layer, a light emitting active layer disposed on the first semiconductor layer, and a second semiconductor layer disposed on the first semiconductor layer;
   a contact layer disposed on an upper surface of the mesa;
   a passivation layer covering sidewalls of the mesa and the contact layer; and
   a cap structure comprising a reflective layer covering an upper surface of the contact layer, and a solder layer comprising a recess in which the reflective layer is disposed.

2. The device of claim 1, wherein the cap structure further comprises an adhesion layer disposed between the contact layer and the reflective layer.

3. The device of claim 2, wherein the adhesion layer comprises Ni, Ti, Pt, TiW, or Cr.

4. The device of claim 2, wherein the adhesion layer has a thickness ranging from about 10 angstroms to about 5000 angstroms.

5. The device of claim 1, wherein the cap structure further comprises an adhesion layer disposed between the reflective layer and the solder layer.

6. The device of claim 5, wherein the adhesion layer comprises Ni, Ti, Pt, TiW, or Cr.

7. The device of claim 5, wherein the adhesion layer has a thickness ranging from about 10 angstroms to about 5000 angstroms.

8. The device of claim 1, wherein the cap structure further comprises a wetting layer disposed between the reflective layer and the solder layer.

9. The device of claim 8, wherein the wetting layer comprises Ni, TiW, Pt, Au, Ag, or Cr.

10. The device of claim 1, wherein the solder layer comprises Sn, SnAu, SnAg, SnCu, SnAgCu, SnIn, SnNi, or SnAuNi.

11. The device of claim 1, wherein the reflective layer and the solder layer cover sidewalls of the second semiconductor layer and the active layer.

12. The device of claim 1, wherein the passivation layer is disposed between the reflective layer and the sidewalls of the second semiconductor layer and the active layer.

13. The device of claim 1, wherein the reflective layer comprises Al, Ag, Au, or any combination thereof.

14. The device of claim 13, wherein the reflective layer has a thickness ranging from about 500 angstroms to about 5000 angstroms.

15. The device of claim 1, wherein the cap structure comprises:
   a first adhesion layer disposed between the contact layer and the reflective layer;
   a second adhesion layer disposed between the reflective layer and the solder layer; and
   a wetting layer disposed between the second adhesion layer and the solder layer.

16. The device of claim 1, wherein the device comprises a recess at least partially defined by sidewalls of the first semiconductor layer and a lower surface of the cap structure.

17. The device of claim 1, wherein the passivation layer covers edges of the upper surface of the contact layer.

* * * * *